(12) United States Patent
Van Kervinck et al.

(10) Patent No.: US 11,501,952 B2
(45) Date of Patent: Nov. 15, 2022

(54) MEMORY DEVICE WITH PREDETERMINED START-UP VALUE

(71) Applicant: ASML Netherlands B.V., Veldhoven (NL)

(72) Inventors: Marcel Nicolaas Jacobus Van Kervinck, Delft (NL); Marco Jan-Jaco Wieland, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 309 days.

(21) Appl. No.: 16/805,509

(22) Filed: Feb. 28, 2020

(65) Prior Publication Data
US 2020/0203125 A1 Jun. 25, 2020

Related U.S. Application Data

(63) Continuation of application No. PCT/JP2018/032518, filed on Aug. 28, 2018.
(Continued)

(51) Int. Cl.
*H01J 37/31* (2006.01)
*H01L 37/04* (2006.01)
(Continued)

(52) U.S. Cl.
CPC ........ *H01J 37/3177* (2013.01); *H01J 37/045* (2013.01); *H01J 37/3175* (2013.01); *H01L 27/1104* (2013.01); *H01L 27/11253* (2013.01)

(58) Field of Classification Search
CPC .. H01J 37/3177; H01J 37/045; H01J 37/3175; H01L 27/1104; H01L 27/11253
(Continued)

(56) References Cited

U.S. PATENT DOCUMENTS

| 4,805,143 A | 2/1989 | Matsumoto et al. |
| 5,854,109 A | 12/1998 | Sheng et al. |

(Continued)

FOREIGN PATENT DOCUMENTS

| EP | 0991118 A1 | 4/2000 |
| JP | 06060667 A | 3/1994 |

(Continued)

OTHER PUBLICATIONS

PCT Notification of Transmittal of the International Search Report of the International Searching Authority dated Nov. 13, 2018, in the corresponding PCT International Application No. PCT/JP2018/032518 (3 pgs.).

*Primary Examiner* — Nicole M Ippolito
(74) *Attorney, Agent, or Firm* — Finnegan, Henderson, Farabow, Garrett & Dunner, LLP

(57) ABSTRACT

A method for making a semiconductor memory device comprising a plurality of memory cells for storing one or more data values, the method comprising: exposing a pattern on a wafer for creating structures for a plurality of memory cells for the semiconductor memory device, wherein the pattern is exposed by means of one or more charged particle beams; and varying an exposure dose of the one or more charged particle beams during exposure of the pattern to generate a set of one or more non-common features in one or more structures of at least one of the memory cells, so that the structures of the at least one memory cell differ from the corresponding structures of other memory cells of the semiconductor memory device.

20 Claims, 16 Drawing Sheets

Related U.S. Application Data

(60) Provisional application No. 62/550,727, filed on Aug. 28, 2017.

(51) Int. Cl.
  *H01L 27/11* (2006.01)
  *H01J 37/317* (2006.01)
  *H01J 37/04* (2006.01)
  *H01L 27/112* (2006.01)

(58) Field of Classification Search
  USPC ... 250/492.1, 492.2, 492.21, 492.22, 492.23, 250/492.3
  See application file for complete search history.

(56) References Cited

U.S. PATENT DOCUMENTS

| | | |
|---|---|---|
| 2004/0006208 A1 | 4/2004 | Layman et al. |
| 2006/0197959 A1* | 9/2006 | Barwicz ................. G01C 19/66 356/470 |
| 2009/0317937 A1* | 12/2009 | Gupta ................... H01L 31/068 257/E21.001 |
| 2014/0229904 A1* | 8/2014 | Fujimura ............ H01J 37/3175 716/54 |
| 2016/0254269 A1 | 9/2016 | Kim et al. |

FOREIGN PATENT DOCUMENTS

| | | |
|---|---|---|
| JP | 2002368137 A | 12/2002 |
| JP | 2012146378 A | 8/2012 |
| WO | WO 2013171216 A1 | 11/2013 |
| WO | WO 2015124613 A1 | 8/2015 |

\* cited by examiner

MEMORY DEVICE WITH PREDETERMINED START-UP VALUE

CROSS-REFERENCE TO RELATED APPLICATIONS

This application claims priority to International Application No. PCT/JP2018/032518, filed Aug. 28, 2018, and published as WO 2019/045087 A1, which claims priority of U.S. Provisional Application No. 62/550,727, filed on Aug. 28, 2017. The contents of these applications are each incorporated herein by reference in their entireties.

TECHNICAL FIELD

The disclosed embodiments relate to a memory device. More specifically, the disclosed embodiments relate to a semiconductor memory device having a predetermined start-up value.

BACKGROUND

Semiconductor memory is typically formed from a large array of memory cells. The memory cell is an electronic circuit that stores one bit of binary information and is set to store a logic 1 (e.g. high voltage level) or reset to store a logic 0 (e.g. low voltage level). A memory cell is also known as a bit cell. In a Random-Access Memory (RAM) the bit value may be maintained (stored) until it is changed by a set or reset process. In a Read-Only Memory (ROM) the bit value may be hard-wired and unchangeable after manufacture, but can be accessed by reading from the memory cell.

A RAM typically stores data as long as power is applied: it is a volatile memory. One type of RAM is an SRAM (Static RAM), which is called 'static' because no periodic refresh is needed as in a DRAM (Dynamic RAM). An SRAM memory cell has more components and uses more chip space than a DRAM memory cell, but reading from and writing to an SRAM is generally much faster than from a DRAM. For this reason, SRAM is typically used for registers and cache memories.

With reference to FIG. 7, one implementation of an SRAM bit cell comprises two cross-coupled inverters that hold the bit value Q (and its complement $\overline{Q}$) and two access transistors. The SRAM comprises an array of memory cells, with word lines (WL) used to address a row of bit cells and bit lines (BL and $\overline{BL}$) used for reading and writing from an addressed memory cell. In this example, the bit lines are used differentially, meaning that the difference between the data present on the two bit lines BL and BL is sensed to read the stored data value. This optional differential technique is useful for large memories having long lines connected to many memory cells in each column and are typically provided in order to improve noise margins.

A typical implementation of an SRAM memory cell uses six transistors in the form of MOSFETs, such as the example shown in FIG. 8. The data stored in the memory cell is stored using four transistors M1, M2, M3, M4 that form the two cross-coupled inverters of FIG. 7. For example, M1 and M3 may be NMOS MOSFETs and M2 and M4 may be PMOS MOSFETs. This memory cell has two stable states which are used to denote 0 and 1. Two additional access transistors M5 and M6 serve to control access to the memory cell during read and write operations. M5 and M6 may be NMOS MOSFETs.

Access to the memory cell is enabled by the word line (WL in FIG. 8) which controls the two access transistors M5 and M6 which, in turn, control whether the memory cell should be connected to the bit lines BL and $\overline{BL}$, which are used to transfer data for both read and write operations. A single bit lines could also be used. During read accesses, the bit lines are actively driven high and low by the inverters in the SRAM memory cell. This improves SRAM bandwidth compared to e.g. DRAMs in which each bit line is connected to storage capacitors and charge sharing causes the bit line to swing upwards or downwards. The symmetric structure of SRAMs also allows for differential signaling, which makes small voltage swings more easily detectable. Another factor that contributes to making SRAM faster than DRAM is that commercial SRAM chips accept all address bits at the same time. By comparison, commodity DRAMs have the address multiplexed in two halves, i.e. higher bits followed by lower bits, over the same package pins in order to keep the chip size and cost down. FIG. 10 shows an example of an SRAM including memory cells, word lines and bit lines.

There is always some variability in semiconductor manufacturing processes which results in unintended random variations in the resulting semiconductor devices being manufactured. Any circuit design, when fabricated in silicon, typically exhibits slightly different electrical behavior from one chip to another even if the design, mask (in case of mask based lithography) and fab are identical. This variability forms the basis of physically unclonable function (PUF) technology which has been proposed for applications with high security requirements, such as authentication systems. A PUF is an entity embodied in a physical structure that is easy to evaluate but hard to predict and almost impossible to duplicate. PUFs depend on the uniqueness of their physical microstructure which in turn depends on random physical factors introduced during manufacturing. These factors are unpredictable and uncontrollable, which makes it virtually impossible to duplicate or clone the structure. PUFs can be used for example as a unique and untamperable device identifier.

A PUF circuit may be designed to produce a data value, such as a cryptographic key. This data value may be a secret that is to be unreadable and undetectable except for a chip embedding the PUF circuit. This chip may have a provision for a challenge-response mechanism that proves its identity without revealing the underlying cryptographic key from the PUF circuit, or any other provision to use the data value from the PUF circuit without revealing the data value to the outside.

An SRAM may be used as a PUF. An SRAM PUF may be made as an intrinsic PUF which uses the random variations in the structures of the memory cells caused by manufacturing process variations as a source of randomness. Such an SRAM PUF may be based on the intrinsic mismatch present between the two inverters of each SRAM memory cell, which can determine the value of the data bit stored in each memory cell when the SRAM is powered up (the start-up value of the memory cell). Ideally both the inverters should be identical, but due to manufacturing variability, there is almost always some random offset between the two inverters. The start-up state of an SRAM memory cell is determined by this mismatch which is random and virtually unclonable. Typically, a set of start-up data values determined by the start-up state of a set of SRAM cells is used as a PUF, where each cell contributes one bit.

Intrinsic random manufacturing process variations can result in variations in different structures of a typical SRAM memory cell. In SRAM cells, these known variations include intrinsic random dopant fluctuation, intrinsic random line edge and line width roughness, and intrinsic random variations in gate dielectric.

Intrinsic random dopant fluctuation is a source of random process variation which results from the discreteness of dopant atoms in the active region of an active circuit element such as a transistor, e.g. variation of doping in the channel of a MOSFET. It is influenced by the position and number of dopant atoms and has a direct impact on the threshold voltage of the transistor. With the continuing shrink in semiconductor process node, a small change in the number of dopant atoms has a significant impact. For example, for the 180 µm technology node, there are thousands of dopant atoms in a MOSFET channel, whereas this number has reduced to about 100 atoms for the 32 nm technology node.

Intrinsic random line edge roughness implies a condition wherein the gate of a transistor does not have a constant length or width, because the edges of the gate are not straight but rough lines. The deviation of the edges from the mean straight line is known as Line Edge Roughness (LER), while the deviation from the mean gate length is known as Line Width Roughness (LWR).

The high-k gate dielectric used in technologies like the 45 nm technology node is highly susceptible to variations in the gate dielectric, such as variations in gate oxide thickness, oxide charges, and interface traps. Intrinsic random physical changes in the dielectric result in parametric variations in drive current, gate tunneling current, or threshold voltage of a MOSFET.

A disadvantage of an SRAM PUF which relies on random variations in the structure of its memory cells caused by random uncontrolled manufacturing process variations is that the start-up value of the SRAM is random, and can only be determined after manufacture. Furthermore, the start-up value may not be stable, since it relies on small random variations which affect the operation of the SRAM inverters, which can be affected by environmental conditions such as varying temperature or supply voltage.

A ROM stores data even when no power is applied, it is a non-volatile memory. An example of a ROM is a Mask ROM, which typically consists of a grid of word lines (the address input) and bit lines (the data output), selectively joined together with transistor switches. The Mask ROM can represent an arbitrary look-up table with a regular physical layout and predictable propagation delay.

FIG. 11 shows an example of a Mask ROM. Each memory cell has zero or one transistor to produce either a binary "1" or a binary "0". With the relevant address-decoded word line driven with a "1", the associated bit line will be a "0" if an open-drain transistor with grounded source terminal is present; otherwise a pull-up resistor (not shown) holds the output at a "1" state.

A disadvantage of Mask ROMs is that the circuit configuration of a Mask ROM, and thus the data value stored in the Mask ROM, can be detected by conventional inspection or reverse engineering techniques.

There is a need for a solution wherein the start-up value of a memory device can be predetermined without being physically detectable.

It is known that, after a layer of a chip has been created, a doping or implanting process may be performed to achieve different memory values in a ROM. Such known doping or implanting process disadvantageously requires a separate, dedicated process for the implanting of the active region. One example hereof is disclosed in US 2016/254269 A1, wherein a memory device includes a plurality of ROM cells each having spaced apart source and drain regions formed in a substrate with a channel region there between, a first gate disposed over and insulated from a first portion of the channel region, a second gate disposed over and insulated from a second portion of the channel region, and a conductive line extending over the plurality of ROM cells. The conductive line is electrically coupled to the drain regions of a first subgroup of the ROM cells, and is not electrically coupled to the drain regions of a second subgroup of the ROM cells. Alternately, a first subgroup of the ROM cells each includes a higher voltage threshold implant region in the channel region, whereas a second subgroup of the ROM cells each lack any higher voltage threshold implant region in the channel region. Another example hereof is disclosed in EP 0 991 118A1, wherein a multi-level ROM can be obtained in a dual gate EEPROM process flow. The method begins with, on a semiconductor substrate, defining active areas respectively for transistors of ROM cells, transistors of electrically erasable non-volatile memory cells, and additional transistors of the storage circuitry. Then, integrated capacitors are integrated in the storage circuit. According to this method, during the implanting step for forming integrated capacitors, at least an active area of the ROM cell is similarly implanted.

SUMMARY

The disclosed embodiments provide a solution for creating semiconductor memory devices having a start-up data value that can been predetermined in the production process while begin virtually undetectable using inspection or reverse engineering techniques. The memory devices can be implemented in the form of SRAMs or ROMs or other types of memory. The memory devices can be used as PUFs without being dependent on random manufacturing variations. The memory devices can be created such that a physical inspection of the memory cells, e.g. by reverse engineering the memory device using layer removal and electron microscopy does not reveal the measures taken during the production process to set the start-up data values of the memory cells.

The semiconductor memory device may be embedded in a chip. The start-up data value may be inaccessible from outside of the chip embedding the semiconductor memory device.

Advantageously, the start-up data value of a memory cell may be predetermined during manufacturing by varying an exposure dose of one or more charged particle beams during exposure of the pattern. As a result, the start-up value need not be readable after manufacturing to determine the value, taking away the need for a readout circuit that may be exploited by an attacker.

Aspects and features of the disclosed embodiments are further described in the following description and in the claims.

BRIEF DESCRIPTION OF THE DRAWINGS

Embodiments will now be described, by way of example only, with reference to the accompanying schematic drawings in which corresponding reference symbols indicate corresponding parts, and in which:

FIGS. 12a and 12c show an exemplary SRAM memory cell laid out in silicon;

FIG. 12b is a legend for FIG. 12a;

FIG. 13 shows an exemplary tiling of six memory cells of FIG. 12a;

The figures are intended for illustrative purposes only, and do not serve as restriction of the scope or the protection as laid down by the claims.

DESCRIPTION OF EMBODIMENTS

Figure 1:
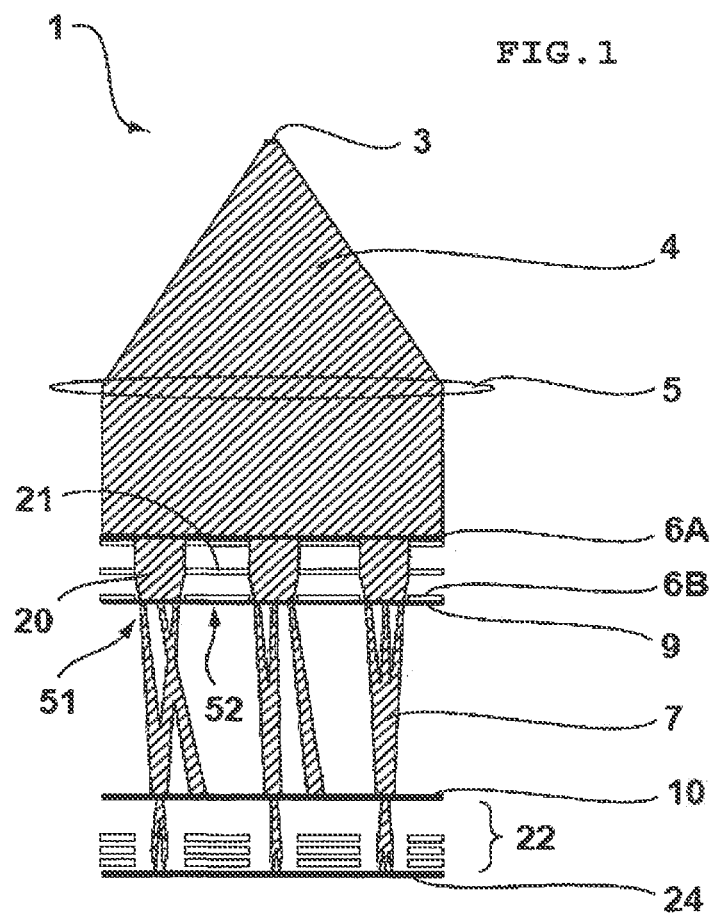
FIG. 1 shows a simplified schematic drawing of an exemplary embodiment of a charged particle multi-beamlet lithography system.

FIG. 1 shows a simplified schematic drawing of an exemplary embodiment of a charged particle multi-beamlet lithography machine 1, which may be used for the creation of one or more layers of a transistor based memory cell. Such a lithography machine suitably comprises a beamlet generator generating a plurality of beamlets, a beamlet modulator patterning said beamlets into modulated beamlets, and a beamlet projector for projecting said beamlets onto a surface of a target. The target is for example a wafer. The beamlet generator typically comprises a source and at least one aperture array. The beamlet modulator is typically a beamlet blanker with a blanking deflector array and a beam stop array. The beamlet projector typically comprises a scanning deflector and a projection lens system.

In the embodiment shown in FIG. 1, the lithography machine 1 comprises an electron source 3 for producing a homogeneous, expanding electron beam 4. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 4 from the electron source 3 may pass a double octopole and subsequently a collimator lens 5 for collimating the electron beam 4. As will be understood, the collimator lens 5 may be any type of collimating optical system. Subsequently, the electron beam 4 may impinge on a beam splitter, which is in one suitable embodiment an aperture array 6A. The aperture array 6A may block part of the beam and may allow a plurality of subbeams 20 to pass through the aperture array 6A. The aperture array preferably comprises a plate having through-holes. Thus, a plurality of parallel electron subbeams 20 may be produced.

A second aperture array 6B may create a number of beamlets 7 from each subbeam. Beamlets are also being referred to as e-beams. The system may generate a large number of beamlets 7, preferably about 10,000 to 1,000,000 beamlets, although it is of course possible to use more or less beamlets. Note that other known methods may also be used to generate collimated beamlets. This allows the manipulation of the subbeams, which turns out to be beneficial for the system operation, particularly when increasing the number of beamlets to 5,000 or more. Such manipulation is for instance carried out by a condenser lens, a collimator, or lens structure converging the subbeams to an optical axis, for instance in the plane of the projection lens.

A condenser lens array 21 (or a set of condenser lens arrays) may be included behind the subbeam creating aperture array 6A, for focusing the subbeams 20 towards a corresponding opening in the beam stop array 10. A second aperture array 6B may generate beamlets 7 from the subbeams 20. Beamlet creating aperture array 6B is preferably included in combination with the beamlet blanker array 9. For instance, both may be assembled together so as to form a subassembly. In FIG. 1, the aperture array 6B produces three beamlets 7 from each subbeam 20, which strike the beam stop array 10 at a corresponding opening so that the three beamlets are projected onto the target by the projection lens system in the end module 22. In practice a much larger number of beamlets may be produced by aperture array 6B for each projection lens system in end module 22. In one embodiment, 49 beamlets (arranged in a 7×7 array) may be generated from each subbeam and are directed through a single projection lens system, although the number of beamlets per subbeam may be increased to 200 or more.

Generating the beamlets 7 stepwise from the beam 4 through an intermediate stage of subbeams 20 has the advantage that major optical operations may be carried out with a relatively limited number of subbeams 20 and at a position relatively remote from the target. One such operation is the convergence of the subbeams to a point corresponding to one of the projection lens systems. Preferably the distance between the operation and the convergence point is larger than the distance between the convergence point and the target. Most suitably, use is made of electrostatic projection lenses in combination herewith. This convergence operation enables the system to meet requirements of reduced spot size, increased current and reduced point spread, so as to do reliable charged particle beam lithography at advanced nodes, particularly at nodes with a critical dimension of less than 90 nm.

The beamlets 7 may next pass through an array of modulators 9. This array of modulators 9 may comprise a beamlet blanker array having a plurality of blankers, which are each capable of deflecting one or more of the electron beamlets 7. The blankers may more specifically be electrostatic deflectors provided with a first and a second electrode, the second electrode being a ground or common electrode. The beamlet blanker array 9 constitutes with beam stop array 10 a modulating device. On the basis of beamlet control data, the modulating means 8 may add a pattern to the electron beamlets 7. The pattern may be projected onto the target 24 by means of components present within an end module 22.

In this embodiment, the beam stop array 10 comprises an array of apertures for allowing beamlets to pass through. The beam stop array, in its basic form, may comprise a substrate provided with through-holes, typically round holes although other shapes may also be used. In one embodiment, the substrate of the beam stop array 8 is formed from a silicon wafer with a regularly spaced array of through-holes, and may be coated with a surface layer of a metal to prevent surface charging. In one embodiment, the metal may be of a type that does not form a native-oxide skin, such as CrMo.

In one embodiment, the passages of the beam stop array 10 may be aligned with the holes in the beamlet blanker array 9. The beamlet blanker array 9 and the beamlet stop array 10 typically operate together to block or let pass the beamlets 7. If beamlet blanker array 9 deflects a beamlet, it will not pass through the corresponding aperture in beamlet stop array 10, but instead will be blocked by the substrate of beamlet block array 10. But if beamlet blanker array 9 does not deflect a beamlet, then it will pass through the corresponding apertures in beamlet stop array 10 and will then be projected as a spot on a target surface 13 of the target 24.

The lithography machine 1 may furthermore comprise a data path for supplying beamlet control data, e.g. in the form of pattern bitmap data, to the beamlet blanker array 9. The beamlet control data may be transmitted using optical fibers. Modulated light beams from each optical fiber end may be projected on a light sensitive element on the beamlet blanker array 9. Each light beam may hold a part of the pattern data for controlling one or more modulators coupled to the light sensitive element.

Subsequently, the electron beamlets 7 may enter the end module. Hereinafter, the term 'beamlet' refers to a modulated beamlet. Such a modulated beamlet effectively comprises time-wise sequential portions. Some of these sequential portions may have a lower intensity and preferably have zero intensity—i.e. portions stopped at the beam stop. Some portions may have zero intensity in order to allow positioning of the beamlet to a starting position for a subsequent scanning period.

The end module 22 is preferably constructed as an insertable, replaceable unit, which comprises various components. In this embodiment, the end module may comprise a beam stop array 10, a scanning deflector array 11, and a projection lens arrangement 12, although not all of these need be included in the end module and they may be arranged differently.

After passing the beamlet stop array 10, the modulated beamlets 7 may pass through a scanning deflector array 11 that provides for deflection of each beamlet 7 in the X- and/or Y-direction, substantially perpendicular to the direction of the undeflected beamlets 7. In this embodiment, the deflector array 11 may be a scanning electrostatic deflector enabling the application of relatively small driving voltages.

Next, the beamlets may pass through projection lens arrangement 12 and may be projected onto a target surface 24 of a target, typically a wafer, in a target plane. For lithography applications, the target usually comprises a wafer provided with a charged-particle sensitive layer or resist layer. The projection lens arrangement 12 may focus the beamlet, for example resulting in a geometric spot size of about 10 to 30 nanometers in diameter. The projection lens arrangement 12 in such a design for example provides a demagnification of about 100 to 500 times. In this preferred embodiment, the projection lens arrangement 12 is advantageously located close to the target surface.

In some embodiments, a beam protector may be located between the target surface 24 and the focusing projection lens arrangement 12. The beam protector may be a foil or a plate, provided with needed apertures, for absorbing the resist particles released from the wafer before they can reach any of the sensitive elements in the lithography machine. Alternatively or additionally, the scanning deflection array 9 may be provided between the projection lens arrangement 12 and the target surface 24.

Roughly speaking, the projection lens arrangement 12 focuses the beamlets 7 to the target surface 24. Therewith, it further ensures that the spot size of a single pixel is correct. The scanning deflector 11 may deflect the beamlets 7 over the target surface 24. Therewith, it needs to ensure that the position of a pixel on the target surface 24 is correct on a microscale. Particularly, the operation of the scanning deflector 11 needs to ensure that a pixel fits well -n- into a grid of pixels which ultimately constitutes the pattern on the target surface 24. It will be understood that the macroscale positioning of the pixel on the target surface is suitably enabled by a wafer positioning system present below the target 24.

Such high-quality projection may be relevant to obtain a lithography machine that provides a reproducible result: Commonly, the target surface 24 comprises a resist film on top of a substrate. Portions of the resist film may be chemically modified by application of the beamlets of charged particles, i.e. electrons. As a result thereof, the irradiated portion of the film may be more or less soluble in a developer, resulting in a resist pattern on a wafer. The resist pattern on the wafer may subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. Moreover, many of such lithography machines make use of a plurality of beamlets. No difference in irradiation ought to result from deflection steps.

Figure 2:
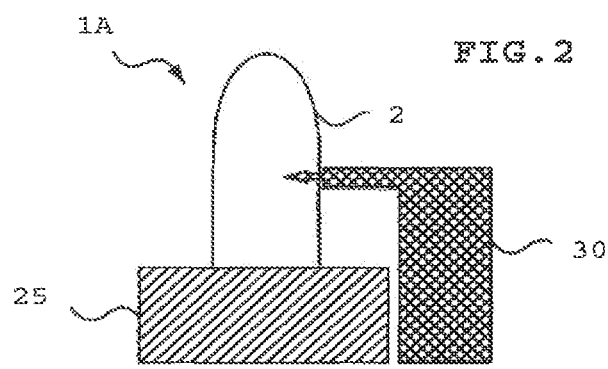
FIG. 2 is a conceptual diagram showing an exemplary maskless lithography system.

FIG. 2 shows a conceptual diagram of an exemplary charged particle lithography system 1A, divided into three high level sub-systems: a wafer positioning system 25, an electron optical column 20, and data path 30. The wafer positioning system 25 moves the wafer 24 under the electron optical column 20 in the x-direction. The wafer position system 25 may be provided with synchronization signals from the data path sub-system 30 to align the wafer with the electron beamlets generated by the electron-optical column 20. The electron-optical column 20 may include the charged particle multi-beamlet lithography machine 1 as shown in FIG. 1. Switching of the beamlet blanker array 9 may also be controlled via the data path sub-system 30, using pattern bitmap data.

Figure 3:
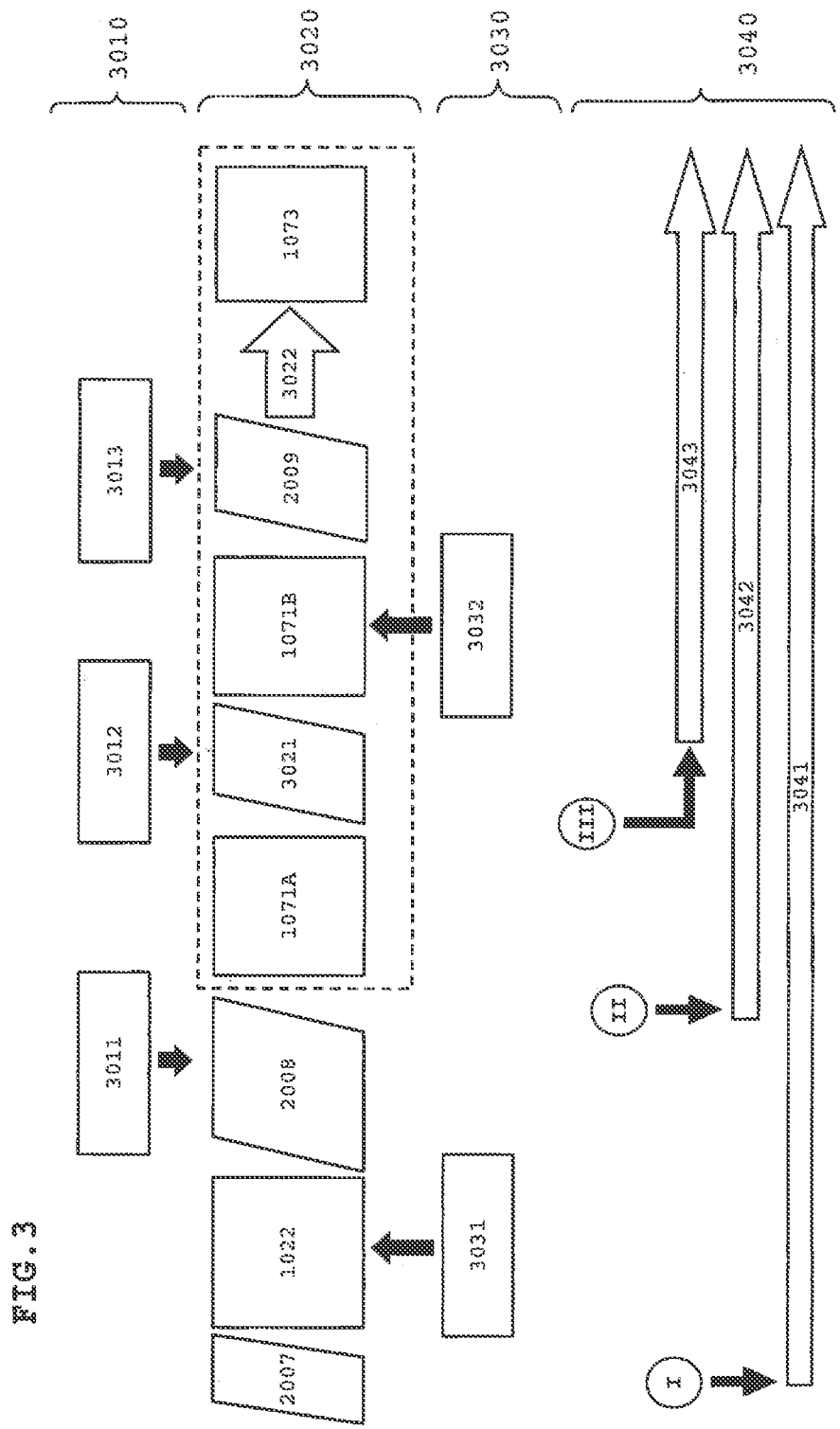
FIG. 3 shows an exemplary functional flow diagram of an embodiment of a data path.

FIG. 3 shows an exemplary functional flow diagram of an embodiment of a data path. In FIG. 3 the functional flow diagram is split into four sections: 3010 is used to indicate a data format of underlying data outputs/inputs; 3020 shows the process flow including data outputs/inputs (parallelograms) and functional elements (rectangles); 3030 is used to indicate process steps performed at overlying functional elements; and 3040 is used to indicate how often the process steps are typically performed, e.g. once per design 3041, once per wafer 3042 or once per field 3043. Roman I, II and III indicate when the feature data set and/or the selection data may be provided to the data path.

Input to the process may be GDS-II design layout data 2007, or a design layout in any other suitable format such as an OASIS data format, defining the chip design to be created using the charged particle lithography machine. A pattern data processing system may preprocess 1022 the GDS-II file, e.g. once per design as indicated by the arrow 3041 at the bottom.

The processes within the dashed block, i.e. from software processing 1071A until hardware processing 1073 are typically performed at the lithography machine 1, 1A enabling a more secure operating environment.

Optionally, a chip design part not part of the GDS-II design may be inserted into the pattern data at various stages in the functional flow, indicated by roman I, II and III.

The optional chip design part may be inserted into the pattern data upon processing of the design layout data input, in this example GDSII input, indicated by roman I. At this stage the pattern data processing is typically performed in a vector based data format. More preferably the insertion of the optional chip design part into the pattern data may be performed at the software processing stage 1071A as indicated by roman II, or at the streaming stage 1071B as indicated by roman III. The S/W processing stage 1071A is typically performed once per wafer, as indicated by the second arrow 3042 from the bottom. The streaming stage 1071B is typically performed once per field or once per chip, as indicated by the third arrow 3043.

The S/W processing stage 1071A and the streaming stage 1071B may be implemented at a pattern streamer. The hardware processing stage 1073 on the right side of the functional flow typically involves the blanker being controlled by the pattern data 2009 including the chip design to be created.

The GDS-II format pattern data may undergo off-line processing 1022, typically including proximity effect correction, resist heating correction, and/or smart boundaries (jointly depicted 3031). The resulting corrected vector pattern data 2008 may be in a vector format an may include dose information, depicted as 3011. This off-line processing 1022 is usually performed once for a given pattern design, for one or more batches of wafers. In case of inserting an optional chip design part at this stage, indicated by roman I, the off-line processing 1022 may need to be performed more frequently, up to once per wafer or even once per field or chip Next, in-line processing of the vector tool input data 2008 may be performed to rasterize the vector data 2008 to generate pattern system streamer (PSS) bitmap data 3021 in e.g. a 4-bit greyscale bitmap format 3012.

This processing is typically performed in software. The optional chip design part may be added at this stage, as indicated by roman II. The pattern streamer may then processes the PSS format data 3021 to generate blanker format data 2009, possibly including corrections involving a full or partial pixel shift in the X and/or Y direction for beam position calibration, field size adjustment, and/or field position adjustment as before on the bitmap data, jointly depicted 3032. Alternatively to entry point II, the optional chip design part may be added at this stage as indicated by roman III. This processing may be performed per field. The blanker format pattern data 2009 may then be transmitted 3022 to the lithography system for exposure of the wafer.

As indicated in FIG. 3, rasterization may be performed at the streaming stage 1071B, which typically involves real-time processing performed in hardware. Corrections for beam position calibration, field size adjustment, and/or field position adjustment 3032 may be performed on vector format PSS format data 3021, and then rasterization may convert this to a blanker format 2009. When the corrections are made on vector data, both full pixel shifts and subpixel shifts in the X and Y direction can be made.

Figure 4:
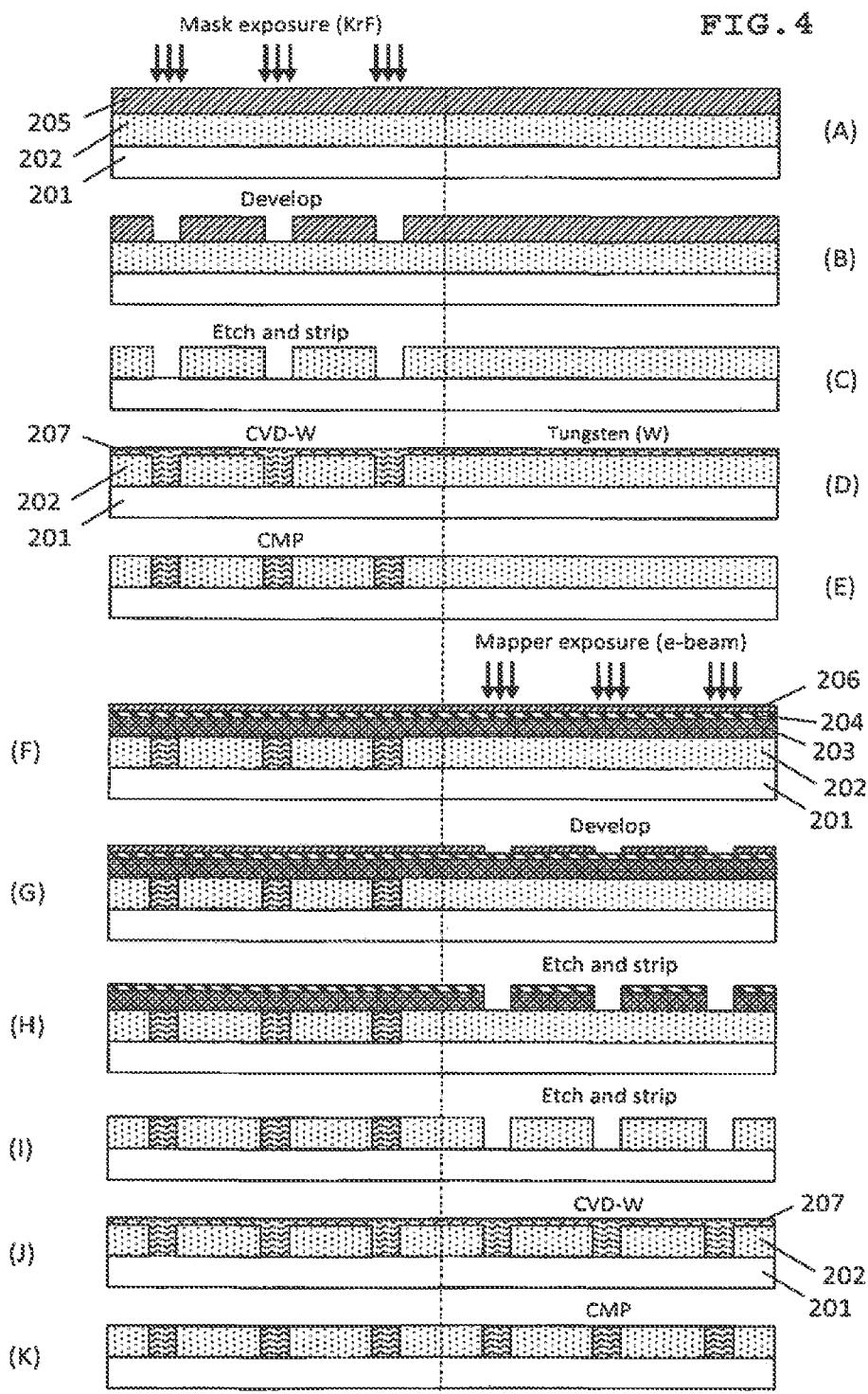
FIGS. 4-6 show exemplary processes of creating a chip.
Figure 5:
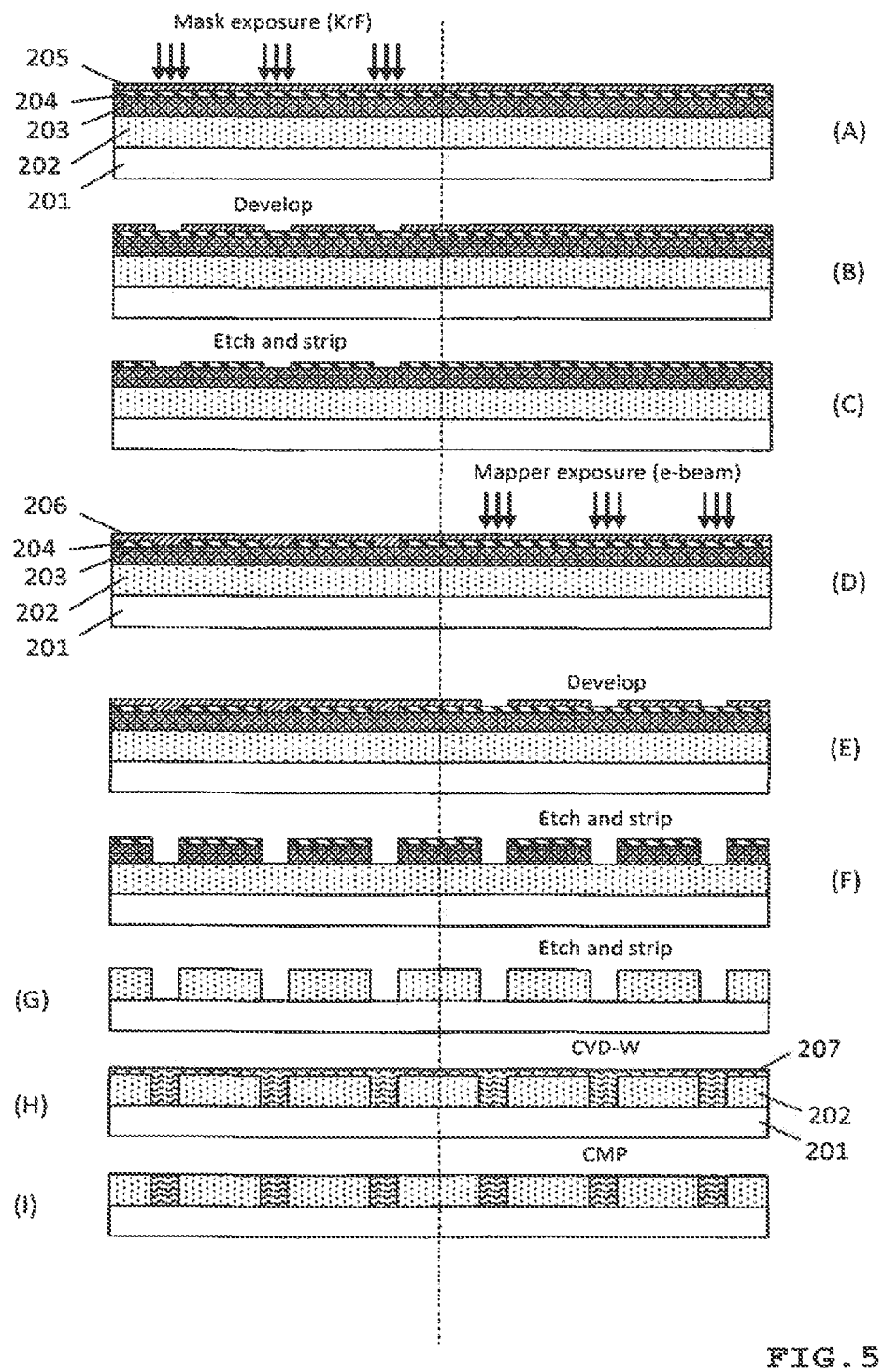
Figure 6:
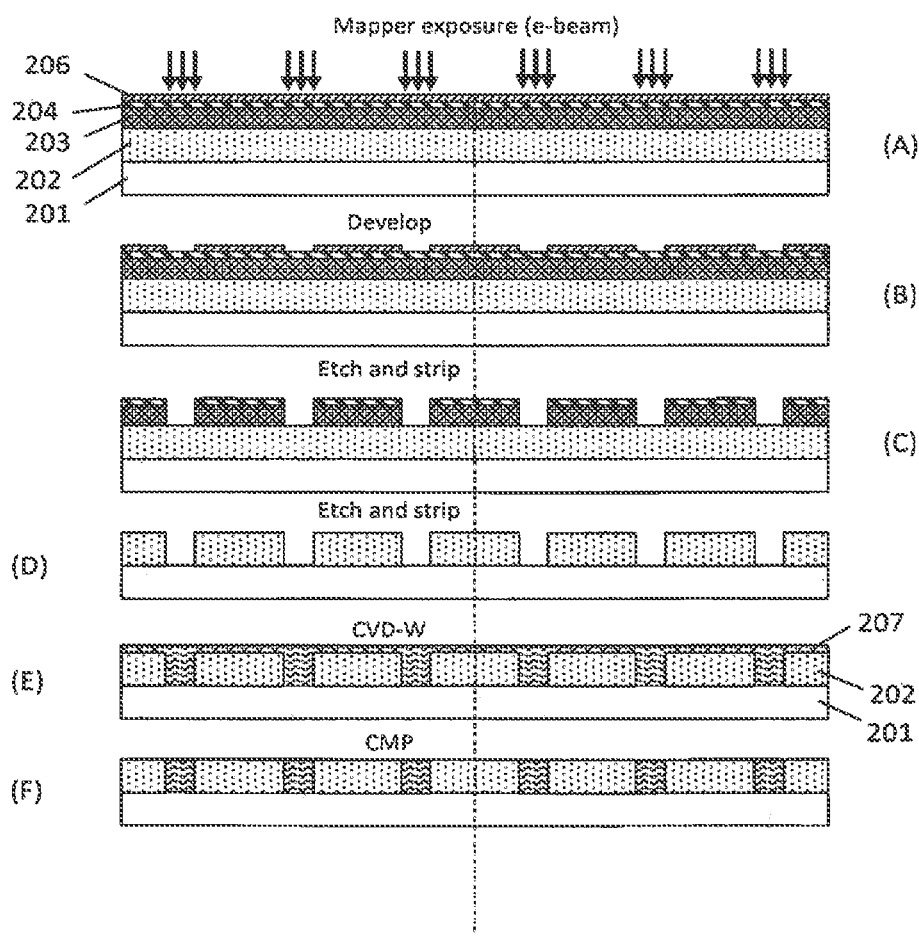
Figure 7:
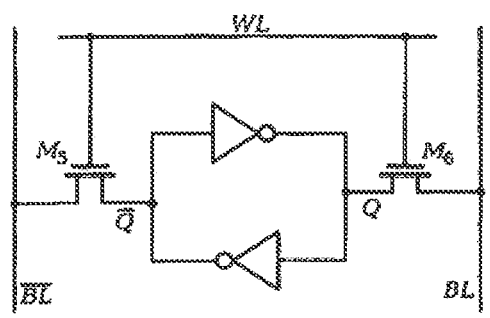
FIGS. 7-8 are circuit diagrams of exemplary SRAM memory cells.

For illustrative purposes, FIGS. 4-6 show examples of processes for fabricating conducting vias for interconnecting two conducting layers of the chip. In a similar manner layers other than a via layer may be created. For example, resist layers may be created before the creation of polysilicon gates or before implanting PMOS or NMOS areas. In other examples, a semiconductor layer may be created for transistors or diodes, a contact layer may be created by forming connections between a metal layer and a gate, and/or a metal layer may be created by forming connections between circuit elements.

FIG. 4 shows an exemplary process of creating a chip. In this example a first part of the chip (the left part in FIG. 4) may be created using photolithography (using a mask) and a second part of the chip (the right part in FIG. 4) may be created using charged particle multi-beamlet lithography (without a mask). At the beginning of the process of FIG. 4 the wafer may comprise a bottom metal layer 201 which has been previously patterned to form conductive connecting lines and an insulating layer 202 (for example SiO2) with resist 205 (e.g. KrF resist) on top as shown in FIG. 4A.

For the creation of the first part, the resist 205 may undergo a mask-based exposure, e.g. using a KrF laser, followed by a development step wherein patterns defined by the mask are removed from the resist layer 205, as shown in FIG. 4B. In an etching and stripping step these patterns may be etched into the insulating layer 202 and the resist is then removed, as shown in FIG. 4C.

Next, a conductive layer 207 may be applied onto the etched and stripped insulating layer, as shown in FIG. 4D. For example a chemical vapor deposition with Tungsten (CVD-W) may be used, as shown in FIG. 4D. Chemical-mechanical planarization (CMP) may be used to remove superfluous conductive material resulting in the wafer having the bottom metal layer 201 and a layer 202 comprising insulating material with conductive material present in the locations where conductive vias are desired, as defined by the mask exposure, shown in FIG. 4E.

Next, for the creation of the second part, the wafer may receive one or more etch barrier films for etching the insulating layer 202. For example, a spin on carbon (SOC) film 203 and a silicon-containing antireflective coating (SiARC) hard mask 204, with an e-beam resist 206 formed on top, covering the insulating layer 202 including the etched part from the mask-based photolithography phase, as shown in FIG. 4F. The resist 206 may undergo a maskless e-beam exposure followed by a development step wherein patterns exposed by the e-beams are removed from the resist 206, as shown in FIG. 4G. In an etching and stripping step these patterns may be etched into the etch barrier films 203 and 204, and the resist may be removed, as shown in FIG. 4H. Next, the patterns that are created in etch barrier films 203, 204 may be etched into the insulating layer 202, and films 203, 204 may be stripped, as shown in FIG. 4I.

Next, a conductive layer 207 may be applied onto the etched and stripped insulating layer 202, as shown in FIG. 4J. For example a chemical vapor deposition with Tungsten (CVD-W) may be used. Chemical-mechanical planarization (CMP) may remove superfluous conductive material, as shown in FIG. 4K, resulting in the wafer having a bottom metal layer 201 and a layer 202 comprising insulating material with conductive material present in the locations where conductive vias are desired, as defined by the mask exposure and the maskless exposure, as shown in FIG. 4K.

In the embodiment of FIG. 4 two CMP steps may be needed. Dishing and double erosion effects caused by the CMP steps can affect the thickness of the insulating layer including the conductive material of the vias. This can have a negative impact on analogue and radio frequency performance of the chip. FIG. 5 shows an improved process for creating chips wherein only a single CMP step may be needed.

FIG. 5 shows another exemplary process of creating a chip. In this example a first part (left in FIG. 5) of the chip may be created using mask-based photolithography and a second part (right in FIG. 5) of the chip may be created using maskless charged particle multi-beamlet lithography.

At the beginning of the process of FIG. 5 the wafer may comprise a bottom metal layer 201 which has been previously patterned to form conductive connecting lines, and an insulating layer 202 (for example SiO2), under etch barrier films 203 and 204 (e.g. SOC+SiARC HM) and a resist 205 (e.g. KrF resist), as shown in FIG. 5A. Advantageously, the etch barrier films 203 and 204 may be used for both the mask-based photolithography and the maskless charged particle multi-beamlet lithography phase, thereby eliminating the need for a CMP step in the photolithography phase, as will be further explained below.

For the creation of the first part, the resist 205 may undergo a mask exposure, e.g. using KrF laser, followed by a development step wherein patterns defined by the mask may be removed from the resist 205, as shown in FIG. 5B. In an etching and stripping step these patterns may be etched into the SOC 204 and the resist is removed, as shown in FIG. 5C.

Next, for the creation of the second part, the wafer may receive an e-beam resist 206, covering the etch barrier films 203 and 204 including the etched part from the photolithography phase, as shown in FIG. 5D. The resist 206 may undergo an e-beam exposure followed by a development step wherein patterns defined by the e-beams may be removed from the resist 206, as shown in FIG. 5E. In an etching and stripping step these patterns may be etched into the etch barrier films 203, 204 and the resist 206 is removed, as shown in FIG. 5F. Next, the patterns created in the etch barrier films 203, 204 in both the mask-based photolithography phase and the maskless charged particle multi-beamlet lithography phase may be etched into the insulating layer 202, and the films 203, 204 may be stripped as shown in FIG. 5G.

Next, a conductive layer 207 may be applied onto the etched and stripped insulating layer 202 for both the first part and the second part of the chip, as shown in FIG. 5H. For example a chemical vapor deposition with Tungsten (CVD-W) may be used. Chemical-mechanical planarization (CMP) may remove superfluous conductive material resulting in the wafer having the bottom metal layer 201 and a layer 202 comprising insulating material with conductive material at locations defined by the mask exposure and the maskless exposure, as shown in FIG. 5I.

An upper metal layer may be deposited over insulating layer 202 and patterned to create a second set of conductive connecting lines, so that the vias formed in insulating layer 202 function as electrical connections between the bottom and upper metal layers.

FIG. 6 shows another exemplary process of creating a chip. In this example, all or a portion of a first part (left in FIG. 6) of the chip as well as a second part (right in FIG. 6) of the chip may be created using maskless charged particle multi-beamlet lithography.

Figure 10:
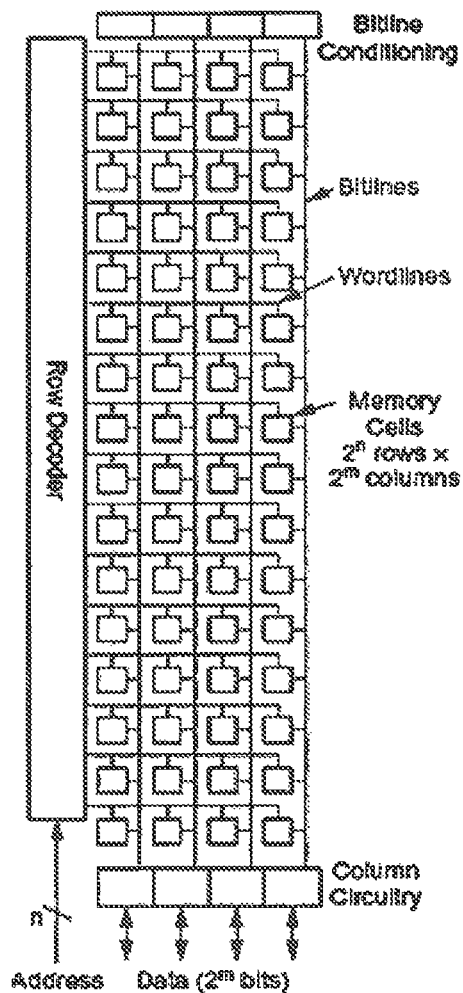
FIG. 10 shows an exemplary SRAM device.

At the beginning of the process of FIG. 6 the wafer may comprise a bottom metal layer 201 which has been previously patterned to form conductive connecting lines, and an insulating layer 202 (for example SiO2), under etch barrier films 203 and 204 (e.g. SOC+SiARC HM) and an e-beam resist 206 (e.g. KrF resist), as shown in FIG. 10A.

The resist 206 may undergo an e-beam exposure followed by a development step wherein patterns defined by the e-beams may be removed from the resist layer 206, as shown in FIG. 6B. In an etching and stripping step these patterns may be etched into the etch barrier films 203, 204 and the resist 206 may be removed, as shown in FIG. 6C. Subsequently the patterns may be etched into the insulating layer 202, and the etch barrier films 203, 204 are stripped, as shown in FIG. 6D.

Next, a conductive layer 207 may be applied onto the etched and stripped insulating layer 202 for both the first part and the second part of the chip, as shown in FIG. 6E. For example a chemical vapor deposition with Tungsten (CVD-W) may be used. Chemical-mechanical planarization (CMP) may remove superfluous conductive material resulting in the wafer having the bottom metal layer 201, and a layer comprising insulating material with conductive material formed at locations as defined by the e-beams, as shown in FIG. 6F.

Figure 8:
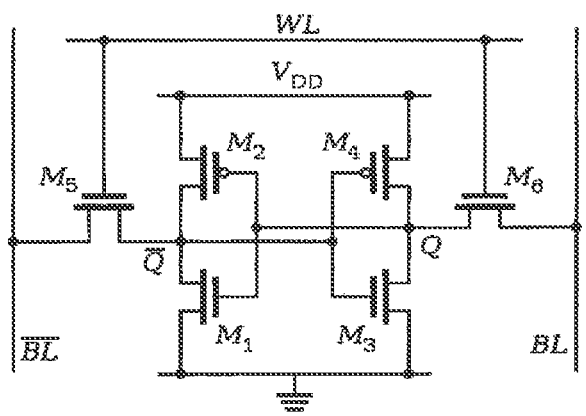
Figure 9:
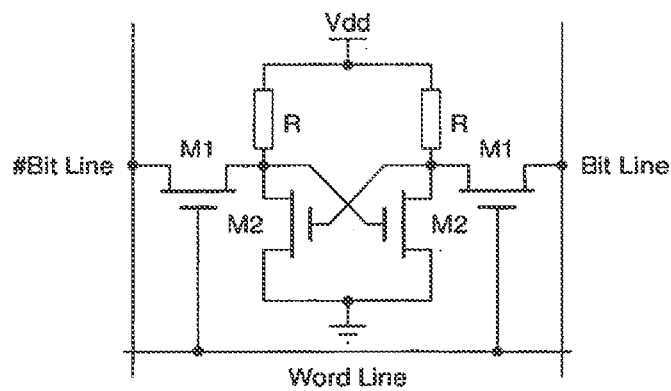
FIG. 9 is a circuit diagram of an exemplary SRAM.
Figures 12A, 12B:
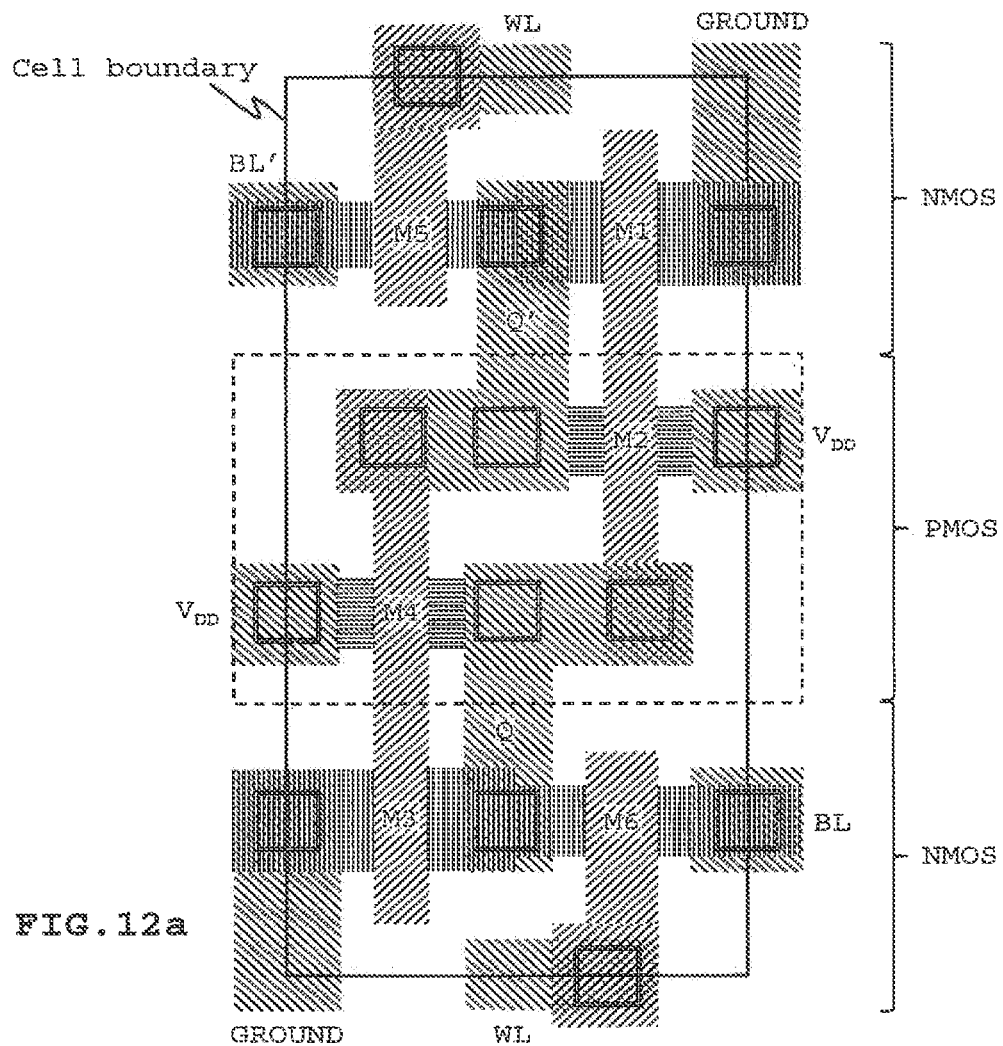

The SRAM cell of FIG. 8 may be laid out in silicon as shown in FIG. 12a. The different patterns used in FIG. 12a are explained in FIG. 12b. In this example the contact diameter is 90 nm and the smallest gate, as drawn, is 70 nm. The gate ratios W/L (width over length) are such that the NMOS pull-downs (M1, M3) are stronger than the access transistors (M5, M6). This increases stability during the read cycle, where the bit lines are pre-charged, put in tri-state and then sensed by opening the access transistors. In a write cycle one of the inverters' inputs will be forced low. To take over the value, the PMOS pull-ups (M2, M4) must be weaker than the access transistors. PMOS is much weaker than NMOS, so the geometry can be approximately the same as the access transistors.

Figure 12C:
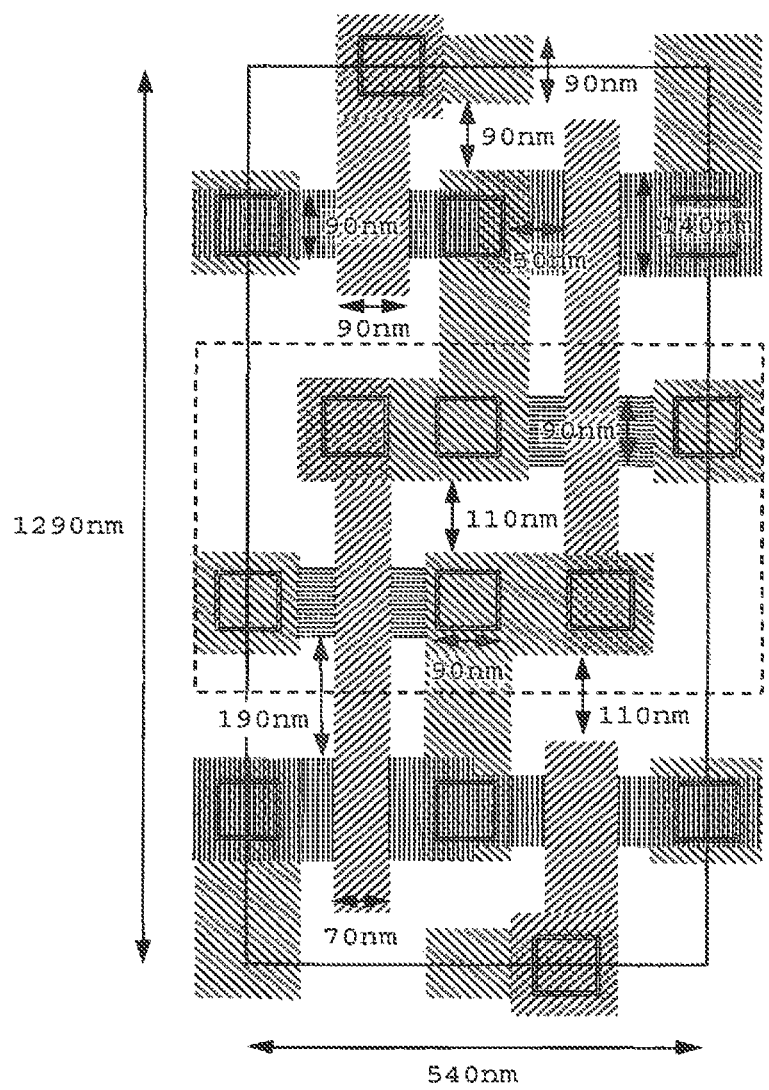

FIG. 12c shows the same 6T-SRAM bit cell again, indicating exemplary dimensions. The example layout is loosely based on a 0.69 μm² design. Although FIG. 12c is not perfectly to scale, actual design rules may be as indicated. The design rules in table 1 may further apply.

TABLE 1 design rules

| Layer | Pitch (nm) | CD/min. space (nm) |
| --- | --- | --- |
| Active (OD) | 190 | 90/100 |
| Poly (PO) | 180 | 70/110 |
| Contact (CO) | 200 | 90/110 |
| Metal-1 (M1-layer) | 180 | 90/90 |
| Via-x, M-x | 210 | 100/110 |
| PO-CO distance | 50 | — |
| N+/P+ distance | 190 | — |
| Gate after etching | 45 | — |

Note that after etching, the gates become shorter than drawn, e.g. as follows: $L_{silicon}=L_{drawn}-25$ nm=45 nm. Also note that the contacts are normally drawn as squares but become round plugs in manufacturing.

Figure 13:
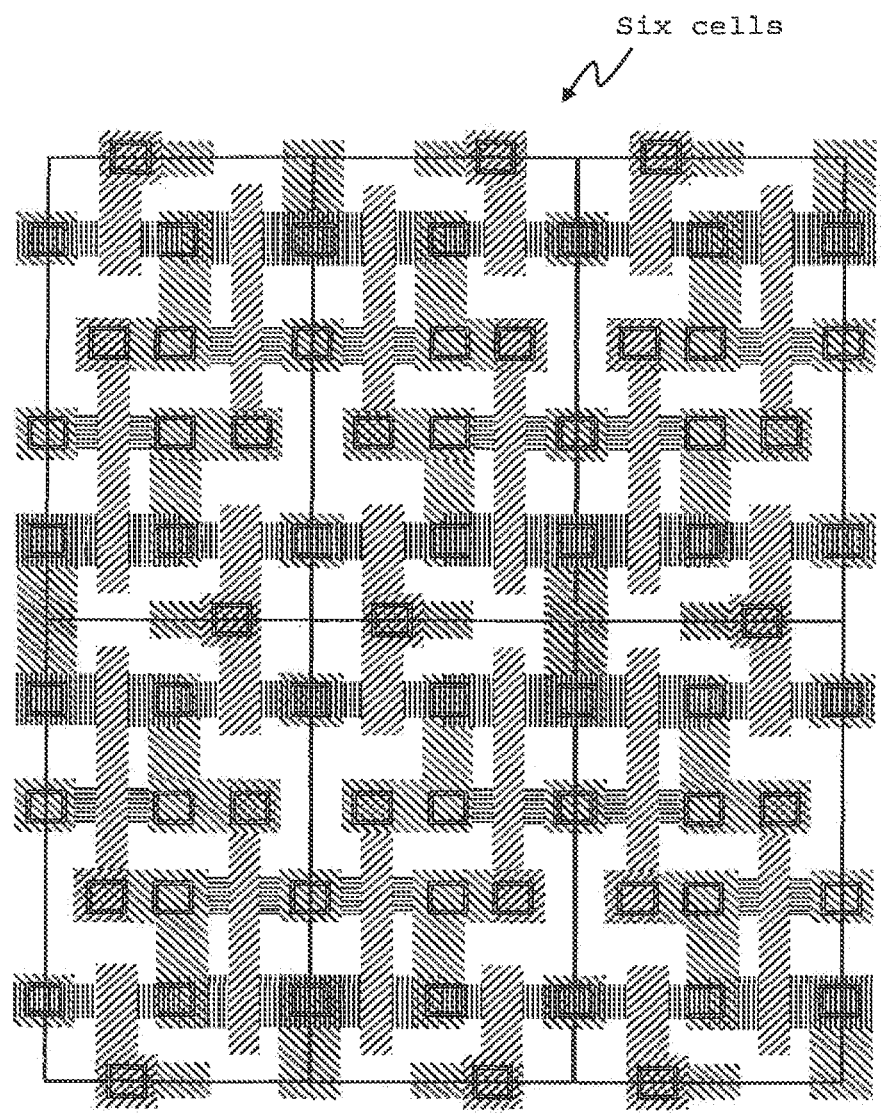

The SRAM cells may be tiled onto a wafer for efficient packaging. An example hereof is shown in FIG. 13, wherein six cells of FIG. 12a with a total of 36 transistors are shown. Adjacent cells are mirrored so that interconnects on the boundaries can be shared for efficient use of space.

Manufacturing of an SRAM may involve photolithography and/or charged particle beam lithography to create the different layers of material together forming the SRAM. Part of the layers form the SRAM cell, for example as shown in FIG. 12a. The poly (PO) lines forming the gates of the transistors, e.g. the poly lines shown in FIG. 12a, may be created using charged particle beam lithography.

Typically, before creating the gates of the transistors of an SRAM cell, the n-Well, p-Well, and n-Channel, p-Channel and Gate oxide film of the n-MOS and p-MOS transistors may have been created. Next, a poly-silicon (polycrystalline silicon) layer may be applied, from which the gate electrode may formed using the CVD method. Similar to the examples of FIGS. 4-6, an e-beam resist may then be applied, possibly including under etch barrier films. Using the charged-particle multi-beamlet lithography machine, the e-beam resist layer may be exposed, thereby creating the pattern of the gates in the e-beam resist layer. The thus created gate resist pattern may be used in a next step to remove the poly-silicon except for where the gates are to be formed. For example, using the gate resist pattern as a mask, the gate may be formed by etching the poly-silicon. After etching, the resist pattern may be removed.

Figure 14:
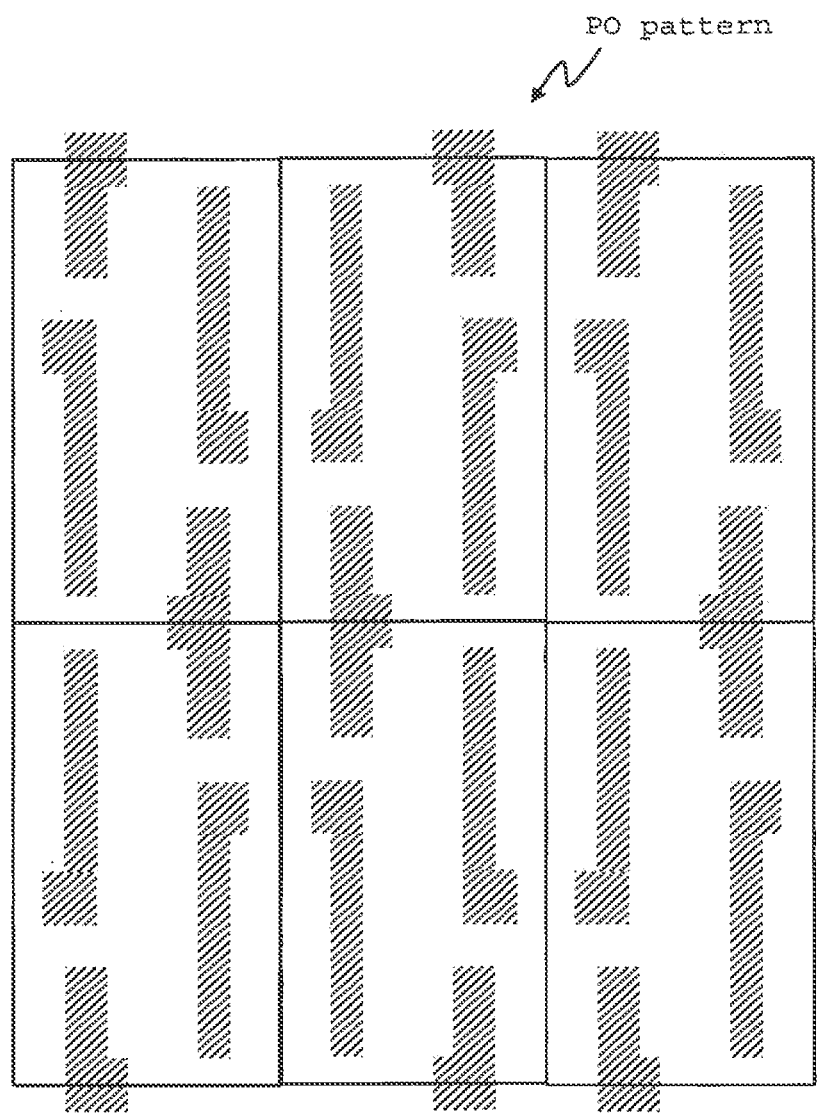
FIG. 14 shows the features of the poly-silicon layer of FIG. 13.

Thus, a PO pattern or "gate" pattern such as shown in FIG. 14 may be created. The pattern in the example of FIG. 14 corresponds with the pattern of the polysilicon layer in FIG. 13.

It has been found that changing the thickness and/or length of at least a part of a gate of an inverter transistor of the SRAM cell may influence the start-up value of the SRAM-cell. The dimensions of one or more gates may thus be changed to achieve a predetermined start-up value of the SRAM cell. Moreover, charged-particle multi-beamlet lithography enables creation of gates having different thickness and/or length while the different dimensions are within design tolerances. As a result, the different dimensions of the gates are physically undetectable, while the start-up value of the SRAM cell may be predetermined.

In order to change the width and/or length of the gates of the inverter transistors, a dose modulation map may be applied to the data to generate beamlet control data 2009, resulting in gate length and/or gate width modification at predefined locations. The dose modulation map may be applied to the data as described for the optional chip design part in the example of FIG. 3. The dose modulation map may function as an alpha channel map for alpha composition of the applied doses to pixels on the wafer. The dose modulation map is typically of a lower resolution than the pixel size on the wafer. A pixel corresponds for example to a 5.3 nm×5.3 nm feature on the wafer, while the resolution of the dose modulation map may be 42 nm×42 nm.

Figure 15:
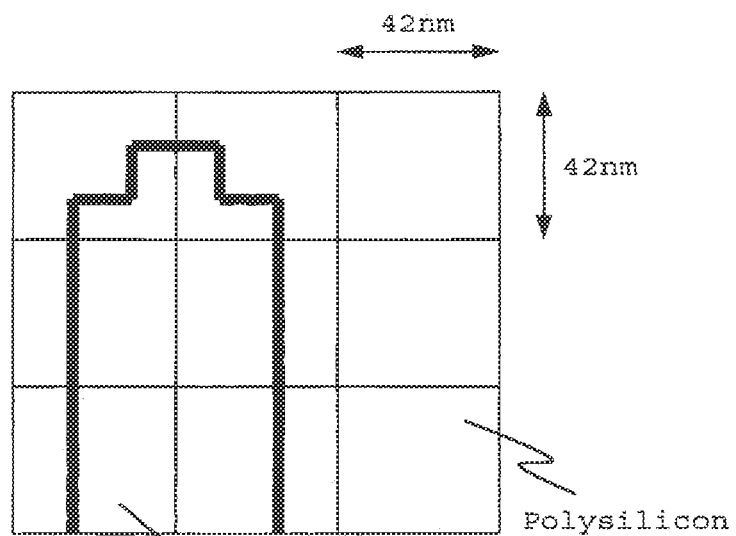
FIG. 15 shows a gate resist on a poly-silicon layer.

FIG. 15 shows an example of a part of a gate pattern exposed onto a resist layer, created using a charged-particle multi-beamlet lithography machine. In this example, the shape of the pattern exposed onto the resist is for forming the gate for a MOSFET in an underlying polysilicon layer. A grid with cells of 42 nm×42 nm is shown superimposed over the exposed gate pattern (the grid is not present on the wafer but merely indicates the location of the dose modulation map cells). In the example of FIG. 15, the exposed gate pattern is formed based on pattern data used to control the charged particle beams, and no dose modulation map is applied. After the exposure, in a next processing step the polysilicon may be removed, except where the resist is present on top of the polysilicon, to form the gate of the MOSFET.

Figure 16:
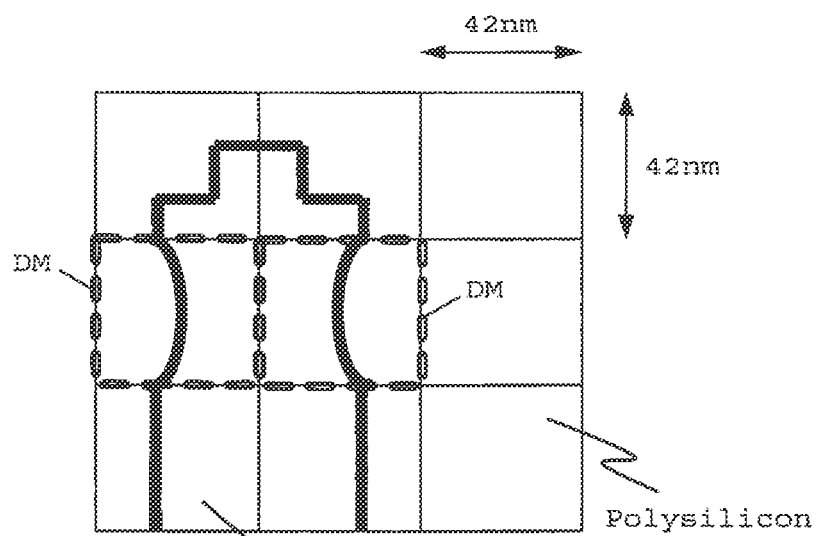
FIG. 16 shows a gate resist on a poly-silicon layer after applying a dose modulation map.

FIG. 16 shows an example of a result of a dose modulation map being applied to the data. The dose modulation map may define that at the locations DM (depicted as dashed blocks) covering two 42 nm×42 nm grid elements, the resist is to be exposed with the same pattern data as in FIG. 15 but with a higher exposure dose of the charged particle beams, e.g. a 20% increase in exposure dose relative to the other grid elements of the does modulation map. Exposure dose modifications may be used within the range of −100% and +100%. As a result, after exposure the gate pattern exposed on the resist layer may be slightly smaller at the locations DM, visualized by the curved shape producing a reduced width of the gate pattern. Removal of the polysilicon in a next processing step may thus result in a gate having a (slightly) smaller dimension at the two grid elements.

The thus changed dimensions of the gate may be designed to influence the start-up value of an SRAM memory cell. The dimensions (such as width and/or length) of one or more gates may thus be changed in this way to achieve a predetermined start-up data value which appears in the memory cells when power is applied to the memory device. Variation of the exposure dose using charged-particle lithography with exposure dose variation enables creation of a circuit design having a large number of transistor gates, where selected ones of the gates have a different dimensions, size, or geometry in order to affect the start-up data value stored in the memory device. The variation in gate dimensions may be kept within the usual design tolerances of the memory device, i.e. within the usual random variations resulting from the variability of the manufacturing process. In this way, the intended variations are virtually indistinguishable from unintended random variations, and reverse engineering of the memory device becomes very difficult, while the start-up value of the memory device may be predetermined.

In a similar manner, dimensions of other structures in the memory device may be altered in a manner which generates a predetermined start-up data value in the memory device while being very difficult to detect.

In an alternative embodiment, the gate features may be written using multi-beam vector writing. In this embodiment the dimensions of a gate may be locally changed to achieve a predetermined start-up value of the SRAM cell by changing the vector pattern or by changing the time/dose per pixel during the vector writing process.

According to another aspect of the disclosed embodiments, the charged-particle multi-beamlet lithography machine may be used to create a resist layer prior to doping or implanting NMOS or PMOS active areas. It is known that a resist layer is applied to cover a PMOS area when implanting an NMOS area, and vice versa that a resist layer is applied to cover a NMOS area when implanting a PMOS area. A PMOS transistor can be intentionally made non-functional by not covering the PMOS area of the transistor during NMOS implantation (for other NMOS transistors), and an NMOS transistor can be intentionally made non-functional by not covering the NMOS area of the transistor during PMOS implantation. The level of doping in an active area (e.g. PMOS or NMOS area) of a transistor is very difficult to detect by physical inspection of a semiconductor device. In order to make detection of the non-functioning transistors even harder to detect, the portion of the PMOS or NMOS area left uncovered may small, resulting in only a small area of incorrect implantation while still achieving a non-functional transistor.

Such physically undetectable non-functional transistors may be used to create physically obfuscated ROMs or other memory devices, wherein the memory cells are created such that a physical inspection of the memory cell, e.g. by reverse engineering the memory chip using layers removal and electron microscopy, does not reveal the measures taken during the production process to predetermine the start-up data values in the memory cells. In the case of ROM memory cells, the start-up data value of a memory cell typically corresponds with the intended ROM content.

Figure 11:
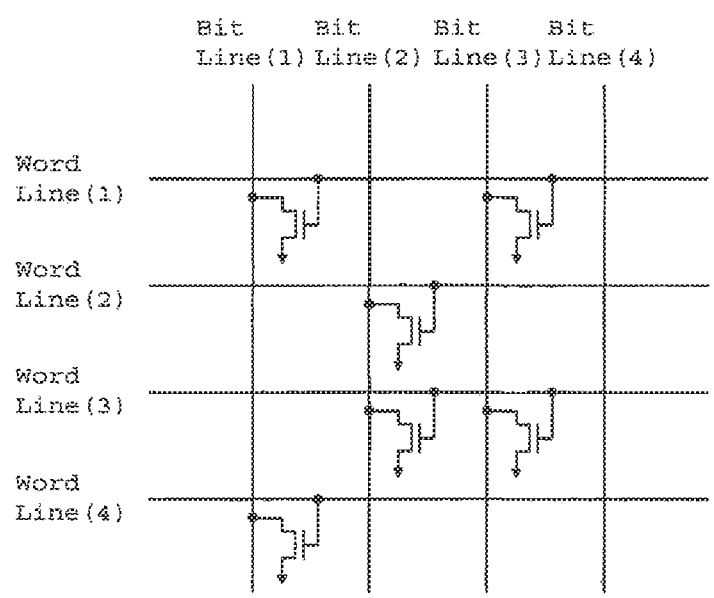
FIG. 11 is a circuit diagram of an exemplary Mask ROM.
Figure 17:
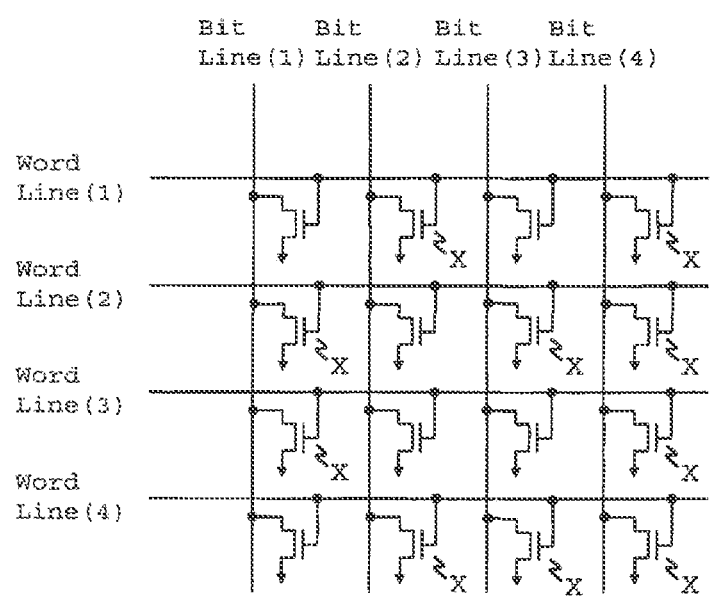
FIG. 17 shows a circuit diagram of an exemplary Mask ROM including defect transistors.

In FIG. 17 a part of an exemplary physically obfuscated ROM is schematically visualized, wherein from the outside all bit lines and word lines appear to be connected to transistors, hence the ROM would be filled with binary "0" values. In fact, the transistors depicted "X" have been created using the above described method, wherein PMOS and/or NMOS areas have been incorrectly implanted and therefore are defective. The ROM of FIG. 17 operates as if it were a ROM as shown in FIG. 11. Thus, in the example of FIG. 17 the data content of the ROM is determined by the working transistors and non-functional transistors, where a non-functional transistor results in a binary "1" (as if there is no transistor present) and a working transistor results in a binary "0".

Alternatively, a ROM content may be determined using a diode matrix, in which case the data content of the ROM may be determined by working diodes and non-functional diodes, where a non-functional diode results in a binary "1" (as if there is no diode present) and a working diode results in a binary "0". Herein, a non-functional diode may be realized in a similar manner as described for the non-functional transistor.

In a similar manner, inverter transistors of SRAM memory cells may be made non-functional in a physically virtually undetectable manner, thereby influencing the start-up data value of the SRAM memory cell.

When the design of a memory device is defined by pattern data to be used in charged particle lithography for making the memory device, an exposure dose modulation map may be applied to the pattern data to achieve that parts of the resist layer are opened to enable incorrect implantation of NMOS or PMOS areas, depending on the implantation phase. The dose modulation map may be applied to the pattern data as described for the optional chip design part in the example of FIG. 3. In this case the dose modulation map may be used to set the exposure dose to 100% at predefined locations, thereby creating openings in the resist layer and allowing a next implantation step to provide doping through the openings to create non-functional transistors.

Figure 18:
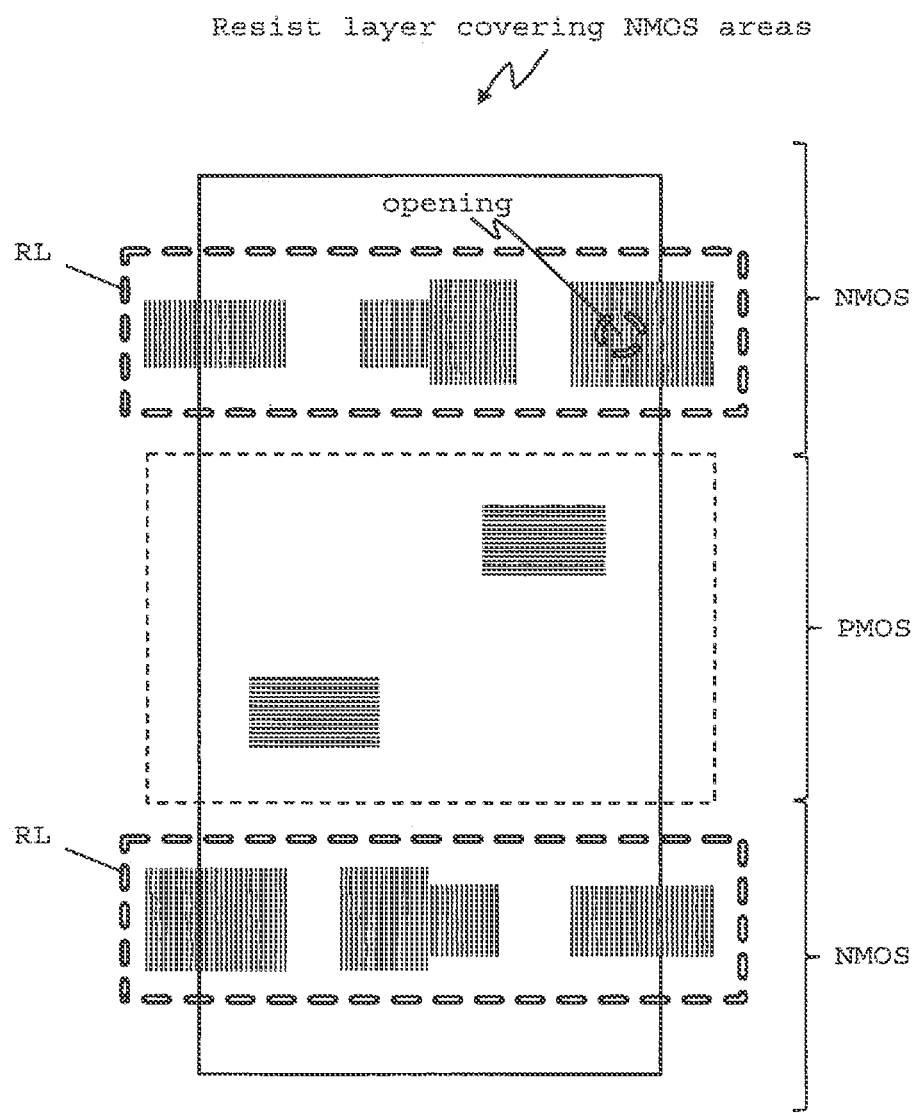
FIGS. 18 and 19 show the features of the N+ and P+ layer of FIG. 13 and exemplary resist layers for blocking an implantation step.

FIG. 18 shows N+ and P+ features in NMOS and PMOS areas of transistors in a SRAM cell, similar to FIG. 12a. In the example of FIG. 18, a resist layer RL has been patterned using charged-particle multi-beamlet lithography. The resist layer RL covers the two NMOS areas. In the resist layer an opening has been created by the patterning to allow transistor M1, which is located underneath the opening in the example of FIG. 12a, to become non-functional after the implanting step of the PMOS areas. The opening may be created using an exposure dose modulation map, as described above. Instead of one opening, multiple openings may be created in the resist layer. The openings can have any shape.

Figure 19:
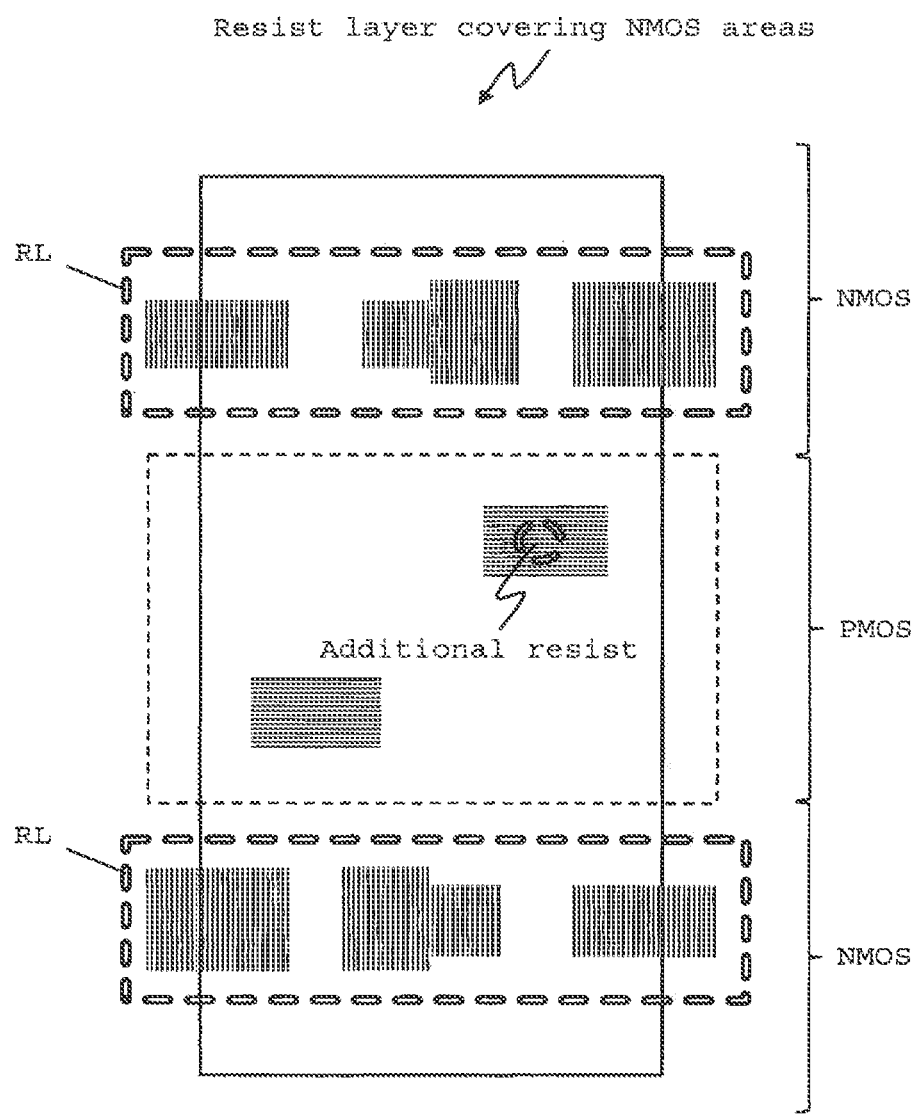

FIG. 19 shows an alternative method for creating non-functional transistors. In FIG. 19 the area that is intended to be implanted is partly covered by the resist layer. As a result the implantation may be insufficient and a transistor may be non-functional as a result. FIG. 19 is similar to FIG. 18. FIG. 19 shows N+ and P+ features in NMOS and PMOS areas of transistors in a SRAM cell, similar to FIG. 12a. In the example of FIG. 19 a resist layer RL has been patterned using charged-particle multi-beamlet lithography. The resist layer RL covers the two NMOS areas. Furthermore, resist covers a part of the PMOS area that is to be implanted. In this example, an active region of transistor M2 (see also the example of FIG. 12a) has been covered by the resist layer, indicated by the additional resist. After the implanting step of the PMOS area, the active region may have received insufficient doping because of the covered portion, resulting in transistor M2 being non-functional. The additional resist may have been created using an exposure dose modulation map, in this case indicating for the additional resist area that a zero exposure dose is to be applied to the resist layer in the patterning step. Instead of one additional resist area, multiple additional resist areas may be created in the resist layer. The additional resist can have any shape.

The method of FIG. 18 and the method of FIG. 19 may be combined.

The embodiments may further be described using the following clauses:

1. A method for making a semiconductor memory device comprising a plurality of memory cells for storing one or more data values, the method comprising:
    exposing a pattern on a wafer for creating structures for a plurality of memory cells for the semiconductor memory device, the structures comprising one or more common features of a plurality of the memory cells, wherein the pattern is exposed by means of one or more charged particle beams in a maskless pattern writer; and
    varying an exposure dose of the one or more charged particle beams during exposure of the pattern to generate a set of one or more non-common features in one or more structures of at least one of the memory cells, so that the structures of the at least one memory cell differ from the corresponding structures of other memory cells of the semiconductor memory device.
2. The method according to clause 1, wherein the semiconductor memory device stores an initial data value, the initial data value being determined at least in part by the set of non-common features of the semiconductor memory device.
3. The method according to clause 1, wherein the semiconductor memory device generates an initial data value in one or more of the memory cells upon power-up of the semiconductor memory device, the initial data value being determined at least in part by the set of non-common features of the semiconductor memory device.
4. The method according to any one of clauses 1-3, wherein the pattern exposed on the wafer is essentially the same for each memory cell of the plurality of memory cells, except for the exposure dose variation.
5. The method according to any one of clauses 1-4, wherein the set of non-common features include a gate of a transistor forming part of one of the memory cells of the semiconductor memory device, and wherein the varying of the exposure dose of the one or more charged particle beams during exposure of the pattern creates a variation in a width and/or a length of the gate without removing the gate.
6. The method according to any one of clauses 1-5, wherein the set of non-common features include an active region of a transistor or diode forming part of one of the memory cells of the semiconductor memory device, and wherein the varying of the exposure dose of the one or more charged particle beams during exposure of the pattern creates one or more openings in a resist layer covering the active area, wherein the openings result in a variation in an N+ or P+ doping of the active region of the transistor in a subsequent doping process.
7. The method according to clause 6, wherein the transistor or diode of the semiconductor memory device is non-functional as a result of the variation of the N+ or P+ doping of the active region of the transistor.
8. The method according to any one of clauses 1-7, wherein the dose variation is derived from application of a dose modulation map to design layout related data used to prepare pattern data for controlling the charged particle beams.
9. The method according to clause 8, wherein the dose modulation map defines a relative change in a dose to be applied at a predefined portion of the pattern.

10. The method according to clause 8, wherein the dose modulation map defines an absolute dose to be applied at a predefined portion of the pattern.
11. The method according to any one of clauses 1-10, wherein the exposure dose variation results in variation of the set of non-common features within manufacturing tolerances of the feature.
12. The method according to any one of the clauses 1-11, wherein the semiconductor memory device is an SRAM or ROM.
13. The method according to any one of the clauses 1-12, further comprising incorporating the semiconductor memory device into a package to form a semiconductor chip.
14. The method according to any one of clauses 1-13, further comprising making a plurality of additional semiconductor memory devices, each semiconductor memory device made according to clause 1,
   wherein the semiconductor memory device and the additional semiconductor memory devices form a set, wherein each semiconductor memory device of the set has a same number of memory cells as the other semiconductor memory devices of the set, and the memory cells of each semiconductor memory device of the set has a same structure as the memory cells of all of the other semiconductor memory devices of the set except for the non-common features,
   wherein the set of semiconductor memory devices comprises a plurality of subsets of semiconductor memory devices, each semiconductor memory device of the set being a member of only one of the subsets, and
   wherein the set of non-common feature of the semiconductor memory devices in a subset is the same, and is different from the set of non-common features of the semiconductor memory devices in every other subset.
15. The method according to clause 14, wherein each semiconductor memory device of the set generates an initial data value upon power-up, the initial data value being determined at least in part by the set of non-common features of the semiconductor memory device.
16. The method according to clause 15, wherein the initial data value of each semiconductor memory device in a subset is the same, and is different from the initial data value of the semiconductor memory devices in every other subset.
17. A semiconductor memory device formed using the method according to any one of the clauses 1-16.
18. A semiconductor memory chip device from by making a semiconductor memory device using the method according to any one of the clauses 1-16, and incorporating the semiconductor memory device into a package to form the semiconductor chip.
19. A semiconductor memory device comprising a plurality of memory cells for storing one or more data values,
   wherein the semiconductor memory device is a member of a set of semiconductor memory devices,
   wherein each semiconductor memory device of the set has a same number of memory cells as all of the other semiconductor memory devices of the set, and the memory cells of each semiconductor memory device of the set has a same structure as the memory cells of all of the other semiconductor memory devices of the set except for a set of one or more non-common features,
   wherein the set of semiconductor memory devices comprises a plurality of subsets of semiconductor memory devices, each semiconductor memory device of the set being a member of only one of the subsets,
   wherein the semiconductor memory device stores an initial data value upon power-up of the semiconductor memory device,
   wherein the initial data value is determined at least in part by the set of non-common features of the semiconductor memory device, and
   wherein the initial data value of the semiconductor memory device is the same as the initial data value of the semiconductor memory devices in each subset and is different from the initial data value of the semiconductor memory devices in every other subset.
20. The semiconductor memory device according to clause 19, wherein the set of non-common features includes a gate of a transistor forming part of one of the memory cells of the semiconductor memory device, and wherein a width and/or a length of the gate is the same as a corresponding width and/or length of the gate of a corresponding transistor of the semiconductor memory devices in each subset, and is different from a corresponding width and/or length of the gate of a corresponding transistor of the semiconductor memory devices in every other subset.
21. The semiconductor memory device according clause 19 or 20, wherein the set of non-common features includes an active region of a transistor forming part of one of the memory cells of the semiconductor memory device, wherein an N+ or P+ doping of the active region is the same as a corresponding active region of a corresponding transistor of the semiconductor memory devices in each subset, and is different from a corresponding active region of a corresponding transistor of the semiconductor memory devices in every other subset.
22. The semiconductor memory device according to clause 21, wherein the transistor of the semiconductor memory device is non-functional as a result of the N+ or P+ doping of the active region of the circuit element.
23. The semiconductor memory device according to any one of clauses 19-22, wherein the set of non-common features is created in part by an exposure dose variation of a charged-particle beam during manufacture of the semiconductor memory device.
24. A maskless pattern writer such as a charged particle multi-beamlet lithography machine (1), configured to expose a pattern on a surface of a target such as a wafer for making a semiconductor memory device using the method according to any one of the clauses 1-16.
25. A manufacturing facility comprising the maskless pattern writer according to clause 24.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the present disclosure will be apparent to those skilled in the art from consideration of the specification and practice of the embodiments disclosed herein. It is intended that the specification and examples be considered as exemplary only, with examples of the true scope and spirit of the disclosed embodiments being indicated by the following claims.

The descriptions above are intended to be illustrative, not limiting. Thus, it will be apparent to one skilled in the art that modifications may be made as described without departing from the scope of the claims set out below.

What is claimed is:

1. A method for making a semiconductor memory device comprising a plurality of memory cells for storing one or more data values, the method comprising:
    exposing a pattern on a wafer for creating structures for a plurality of memory cells for the semiconductor memory device, the structures comprising one or more common features of a plurality of the memory cells, wherein the pattern is exposed by means of one or more charged particle beams in a maskless pattern writer; and
    varying an exposure dose of the one or more charged particle beams during exposure of the pattern to generate a set of one or more non-common features in one or more structures of at least one of the memory cells, so that the structures of the at least one memory cell differ from the corresponding structures of other memory cells of the semiconductor memory device.

2. The method according to claim 1, wherein the semiconductor memory device stores an initial data value, the initial data value being determined at least in part by the set of non-common features of the semiconductor memory device.

3. The method according to claim 1, wherein the semiconductor memory device generates an initial data value in one or more of the memory cells upon power-up of the semiconductor memory device, the initial data value being determined at least in part by the set of non-common features of the semiconductor memory device.

4. The method according to claim 1, wherein the pattern exposed on the wafer is essentially the same for each memory cell of the plurality of memory cells, except for the exposure dose variation.

5. The method according to claim 1, wherein the set of non-common features include a gate of a transistor forming part of one of the memory cells of the semiconductor memory device, and wherein the varying of the exposure dose of the one or more charged particle beams during exposure of the pattern creates a variation in a width and/or a length of the gate without removing the gate.

6. The method according to claim 1, wherein the set of non-common features include an active region of a transistor or diode forming part of one of the memory cells of the semiconductor memory device, and wherein the varying of the exposure dose of the one or more charged particle beams during exposure of the pattern creates one or more openings in a resist layer covering the active area, wherein the openings result in a variation in an N+ or P+ doping of the active region of the transistor in a subsequent doping process.

7. The method according to claim 6, wherein the transistor or diode of the semiconductor memory device is non-functional as a result of the variation of the N+ or P+ doping of the active region of the transistor.

8. The method according to claim 1, wherein the dose variation is derived from application of a dose modulation map to design layout related data used to prepare pattern data for controlling the charged particle beams.

9. The method according to claim 8, wherein the dose modulation map defines a relative change in a dose to be applied at a predefined portion of the pattern.

10. The method according to claim 8, wherein the dose modulation map defines an absolute dose to be applied at a predefined portion of the pattern.

11. The method according to claim 1, wherein the exposure dose variation results in variation of the set of non-common features within manufacturing tolerances of the feature.

12. The method according to claim 1, wherein the semiconductor memory device is an SRAM or ROM.

13. The method according to claim 1, further comprising incorporating the semiconductor memory device into a package to form a semiconductor chip.

14. The method according to claim 1, further comprising making a plurality of additional semiconductor memory devices, each semiconductor memory device made according to claim 1,
    wherein the semiconductor memory device and the additional semiconductor memory devices form a set, wherein each semiconductor memory device of the set has a same number of memory cells as the other semiconductor memory devices of the set, and the memory cells of each semiconductor memory device of the set has a same structure as the memory cells of all of the other semiconductor memory devices of the set except for the non-common features,
    wherein the set of semiconductor memory devices comprises a plurality of subsets of semiconductor memory devices, each semiconductor memory device of the set being a member of only one of the subsets, and
    wherein the set of non-common feature of the semiconductor memory devices in a subset is the same, and is different from the set of non-common features of the semiconductor memory devices in every other subset.

15. The method according to claim 14, wherein each semiconductor memory device of the set generates an initial data value upon power-up, the initial data value being determined at least in part by the set of non-common features of the semiconductor memory device.

16. A maskless pattern writer, comprising:
    a controller configured to control the maskless pattern writer to expose a pattern on a surface of a target such as a wafer for making a semiconductor memory device using the method according claim 1.

17. The maskless pattern writer of claim 16, wherein the semiconductor memory device stores an initial data value, the initial data value being determined at least in part by the set of non-common features of the semiconductor memory device.

18. The maskless pattern writer of claim 16, wherein the semiconductor memory device generates an initial data value in one or more of the memory cells upon power-up of the semiconductor memory device, the initial data value being determined at least in part by the set of non-common features of the semiconductor memory device.

19. The maskless pattern writer of claim 16, wherein the controller is configured to further perform:
    making a plurality of additional semiconductor memory devices, each semiconductor memory device made according to the method;
    wherein the semiconductor memory device and the additional semiconductor memory devices form a set, wherein each semiconductor memory device of the set has a same number of memory cells as the other semiconductor memory devices of the set, and the memory cells of each semiconductor memory device of the set has a same structure as the memory cells of all of the other semiconductor memory devices of the set except for the non-common features, wherein the set of semiconductor memory devices comprises a plurality of subsets of semiconductor memory devices, each semiconductor memory device of the set being a member of only one of the subsets, and wherein the set of non-common feature of the semiconductor memory devices in a subset is the same, and is different from the set of non-common features of the semiconductor memory devices in every other subset.

20. The method according to claim 15, wherein the initial data value of each semiconductor memory device in a subset is the same, and is different from the initial data value of the semiconductor memory devices in every other subset.

* * * * *